United States Patent
Li

(10) Patent No.: US 7,609,101 B2
(45) Date of Patent: Oct. 27, 2009

(54) PWM SWITCHING DIRECT VOLTAGE CIRCUIT

(75) Inventor: Ching-Sheng Li, Hsinchu (TW)

(73) Assignees: Anpec Electronics Corporation, Taoyuan, Taoyuan County (TW); Shou-Te Yu, Hsinchu (TW)

( * ) Notice: Subject to any disclaimer, the term of this patent is extended or adjusted under 35 U.S.C. 154(b) by 58 days.

(21) Appl. No.: 11/907,313

(22) Filed: Oct. 11, 2007

(65) Prior Publication Data
US 2009/0096544 A1    Apr. 16, 2009

(51) Int. Cl.
*H03K 3/017* (2006.01)
*H03K 5/04* (2006.01)
*H03K 7/08* (2006.01)

(52) U.S. Cl. .................................... 327/175

(58) Field of Classification Search ............... 327/175, 327/530, 544, 172; 332/109–111; 375/238
See application file for complete search history.

(56) References Cited

U.S. PATENT DOCUMENTS

2007/0040538 A1    2/2007    Lipcsei et al. .............. 323/282

*Primary Examiner*—David Mis

(57) ABSTRACT

The present invention relates to a pulse width modulation switching direct voltage circuit. The PWM circuit comprises a first passive device, a second passive device and a third passive device connected in series between a power supply and a ground such that the first passive device is connected to the second passive device and the second passive device is connected to the third passive device, and a fourth passive device which is connected in-parallel between an output end and a point between the first passive device and the second passive device, wherein the rated value of the fourth passive device is at least three times more than the rated value of the first passive device. Herewith, the voltage-cycle relationship of the PWM circuit becomes linear. Under such a state, the PWM circuit is enabled with good work efficiency.

12 Claims, 10 Drawing Sheets

PWM SWITCHING DIRECT VOLTAGE CIRCUIT

FIELD OF THE INVENTION

The present invention relates to a PWM switching direct voltage circuit, particular to a PWM switching direct voltage circuit which the corresponding values of the duty cycle and the output voltage are adjusted to linear.

BACKGROUND OF THE INVENTION

Pulse width modulation (PWM) technology is a very effective technology by applying digital output of a microprocessor to control an analog circuit. It is widely applied in many fields such as measurement, communication, power control and transformation.

In short, PWM is a method to encode an analog signal level digitally. By the application of a high resolution counter the duty cycle of a square wave is modulated to encode a specific analog signal level. PWM signal remains to be digital since at any specific moment the direct current supply with full value is either ON or OFF. The voltage or current supply is applied on an analog load by a repetitive pulse sequence of ON or OFF. The direct current supply is applied on the load when it is ON and disconnected with the power supply when it is OFF. If the band width is large enough, any analog value can be encoded by PWM.

Particularly in the application of switching direct voltage circuit, the magnitude and variation extent of the output voltage is controlled by modulating the duty cycle of the pulse width modulation signal.

However, in the most of PWM switching direct voltage circuit applied by power supply the corresponding values of the output voltage and the duty cycle of PWM switching direct voltage circuit are generally in nonlinear state. Under such a state, the work efficiency of PWM is lowered.

Consequently, how to solve above mentioned conventional problems and shortcomings has been an objective of the present invention and manufacturers in the industry.

SUMMARY OF THE INVENTION

The main objective of the present invention is to have the corresponding values of the voltage-cycle of the PWM circuit in linear proportion when the PWM circuit is in operation to enhance the work efficiency of the PWM circuit, wherein it is achieved by having the rated value of the fourth passive device at least three times more than the rated value of the first passive device.

Another objective of the present invention is to convert the corresponding values of the voltage-cycle of the PWM circuit from linear proportion to parabolic proportion to enhance the work speed of the PWM circuit when it is operated, wherein it is achieved by means of the rapid response of the analog switching device which is connected in parallel with the fourth passive device.

DETAILED DESCRIPTION OF THE INVENTION

The other advantage, objective, technical feature and effectiveness of the present invention will be better understood by the detail description of preferred embodiment in conjunction with the following figure.

Figure 1:
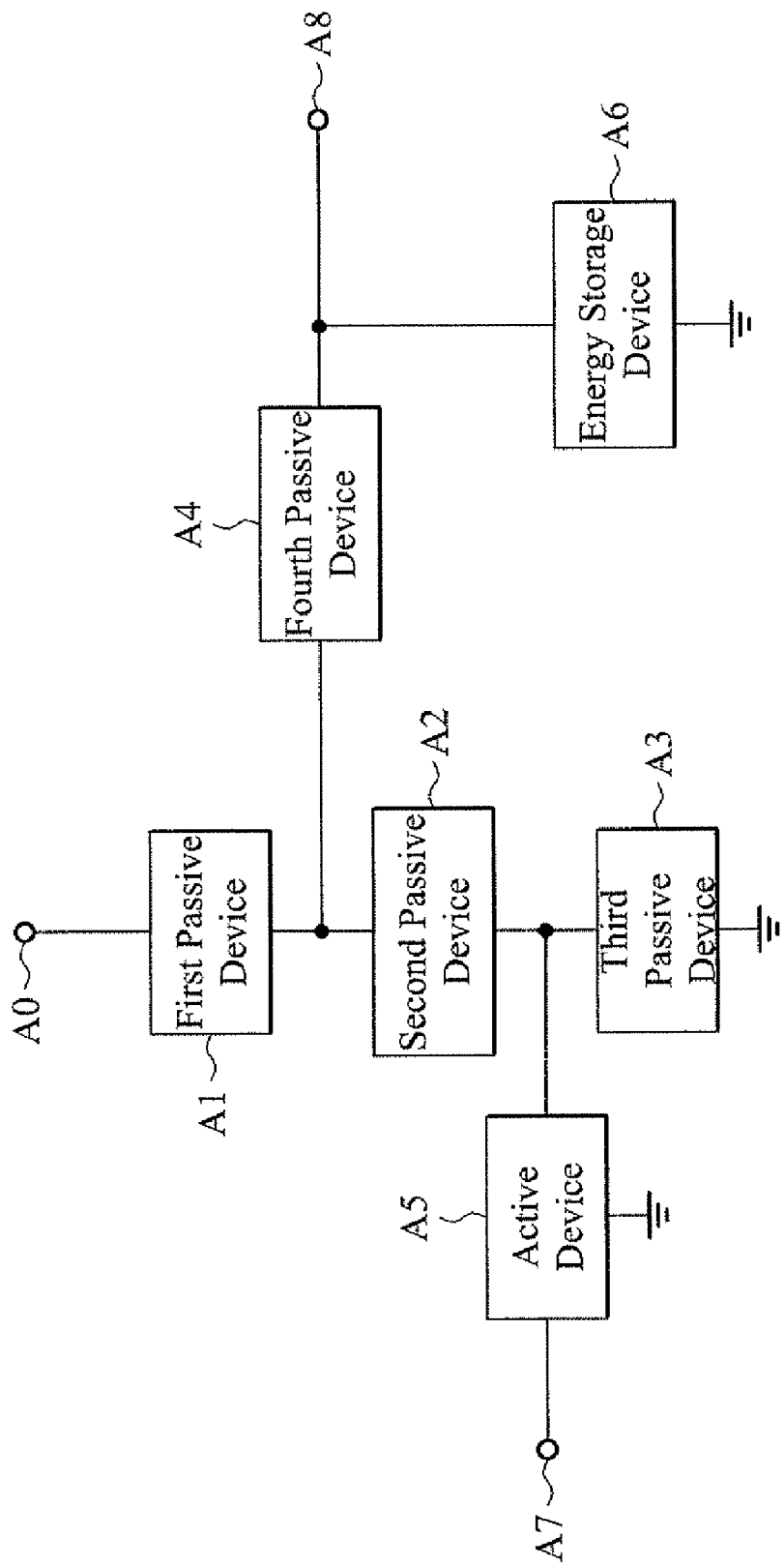
FIG. 1 is a circuit block diagram of an embodiment of the present invention.
Figure 2:
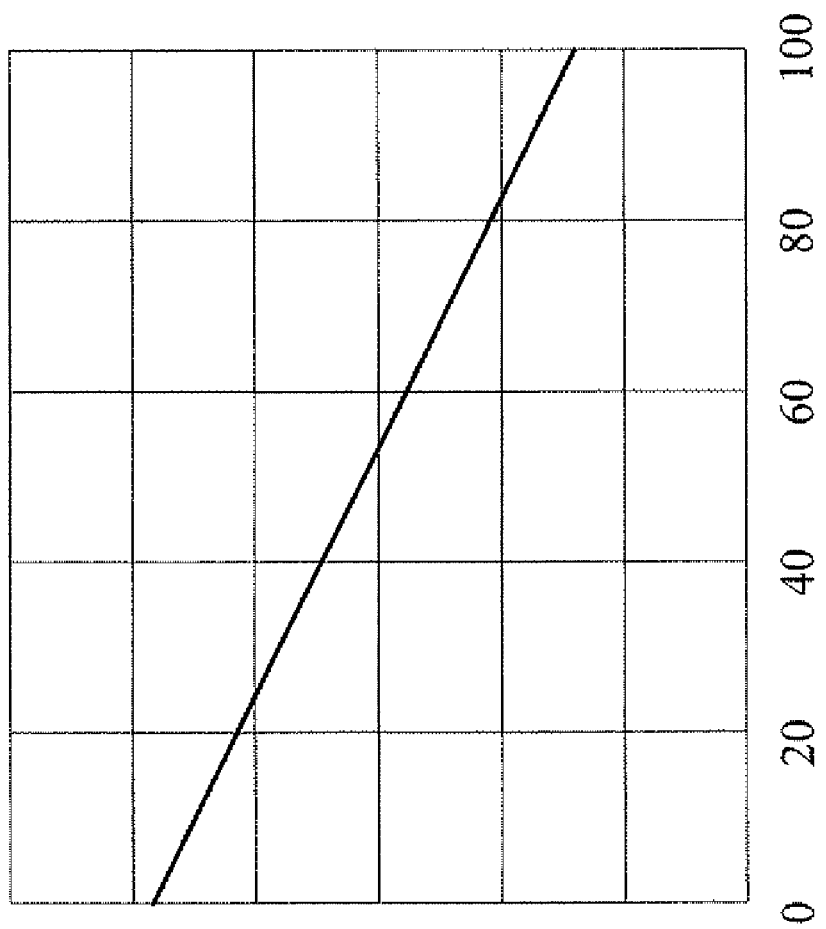
FIG. 2 is a schematic voltage-cycle diagram of an embodiment of the present invention.

Referring to FIG. 1 and FIG. 2, the PWM circuit A of the present invention comprises a first passive device A1, a second passive device A2, a third passive device A3, a fourth passive device A4, an active device A5, an energy storage device A6, an input end A7 and an output end A8, wherein the power supply end A0 is connected with the first passive device A1, the second passive device A2 and the third passive device A3 orderly in series. The active device A5 is connected in parallel with the third passive device, between a ground and a point between the second passive device A2 and the third passive device A3. The fourth passive device A4 is connected in parallel between an output end and a point between the first passive device A1 and the second passive device A2, and the energy storage device A6 is connected between the output end a ground. The rated value of the fourth passive device A4 is at least three times more than the rated value of the first passive device A1.

When the rated value of the fourth passive device A4 is much larger than the rated value of the first passive device A1 the voltage-cycle relationship of the PWM circuit A becomes linear. Under such a state, the PWM circuit A is enabled with good work efficiency.

Figure 3:
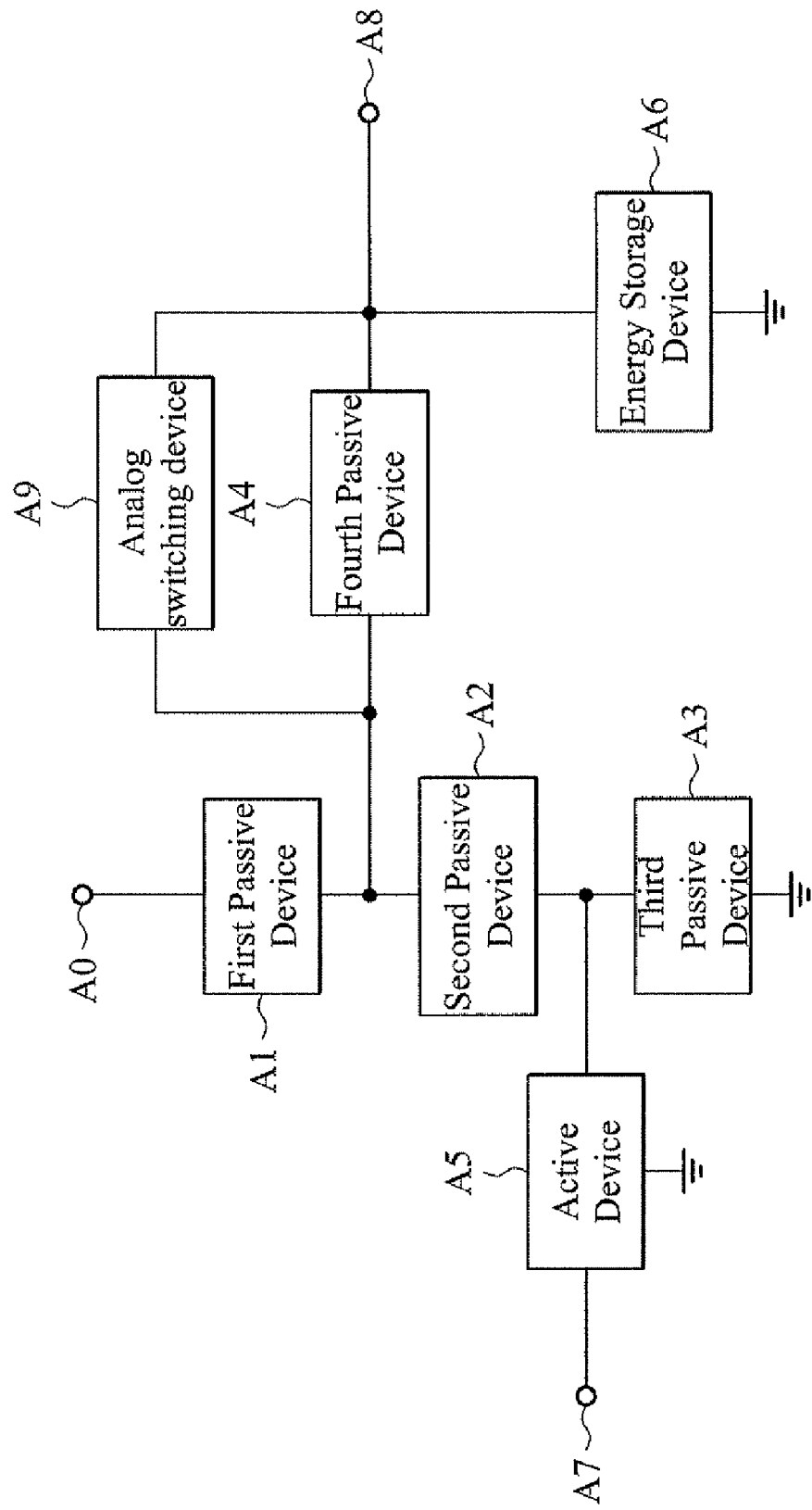
FIG. 3 is a circuit block diagram of another embodiment of the present invention.
Figure 4:
FIG. 4 is a schematic voltage-cycle diagram of another embodiment of the present invention.

Referring to FIG. 3 and FIG. 4, the both ends of the fourth passive device A4 is further connected in parallel with the analog switching device A9 to have the voltage-cycle relationship of the PWM circuit A changed from linear to parabolic to enhance the work speed of the PWM circuit A accordingly.

The above mentioned first passive device A1, the second passive device A2, the third passive device A3 and the fourth passive device A4 is one of the wire wound resistor, metallic film resistor, alloy film resistor, oxide metal film resistor, carbon film resistor, carbon solid state resistor and cement resistor. The above mentioned active device A5 is one of the bipolar junction transistor, field effect transistor, junction type field effect transistor and metal oxide semiconductor. Furthermore, the above mentioned energy storage device A6 is one of the ceramic condenser, electrolytic condenser and tantalum condenser, and the above mentioned analog switching device A9 is Schottky diode.

By the illustration of the above mentioned configuration and constitution design, the operation of the present invention is described as following.

Figure 5A:
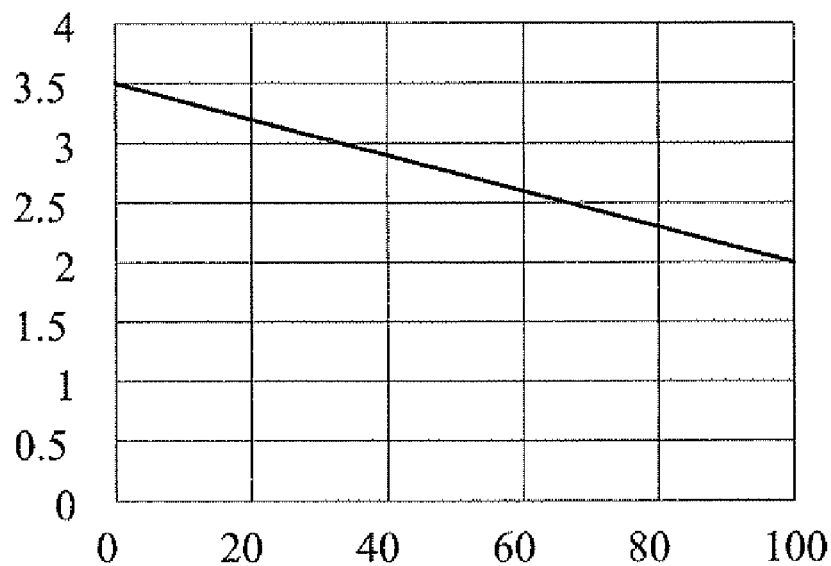
FIG. 5 is the circuit diagram I of an embodiment of the present invention.
Figure 5B:
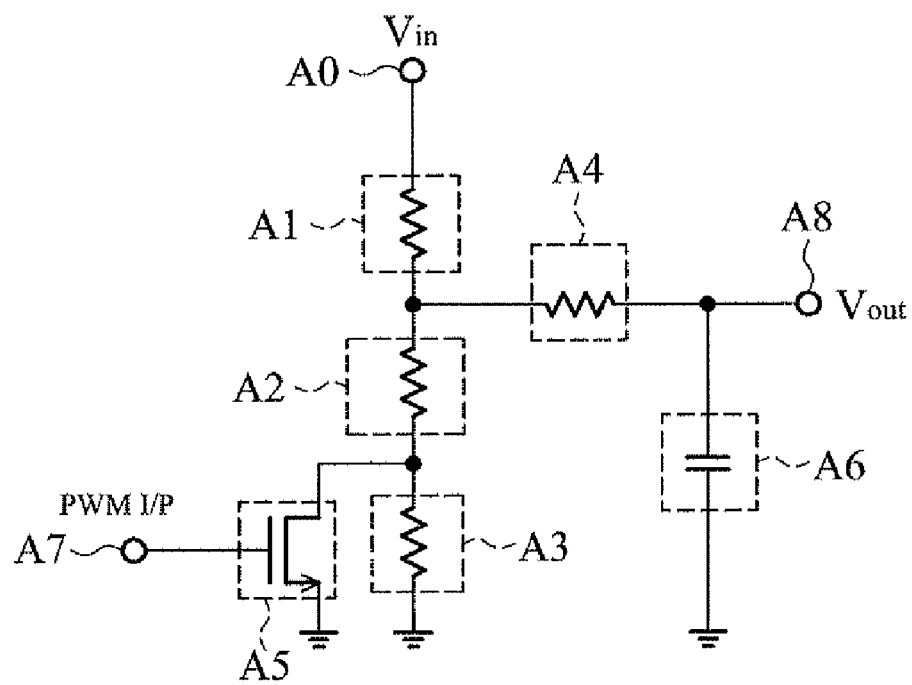

Referring to FIG. 5, 0% and 100% of the duty cycle are represented as reference points. When the duty cycle is 100% as indicated by V(100) the output voltage is 2 volts. When the duty cycle is 0% as indicated by V(0), the output voltage is 3.5 volts. At this moment the rated value of the first passive device A1 is known as 10K ohm and the rated value of the fourth passive device A4 is 200K ohm which is much larger than the rated value of the first passive device A1 and the rated value of the energy storage device A6 is 1 μF. The rated value 6.67K ohm of the second passive device A2 and the rated value 16.67 K ohm of the third passive device A3 are calculated from the split voltage and split current formula.

Figure 6A:
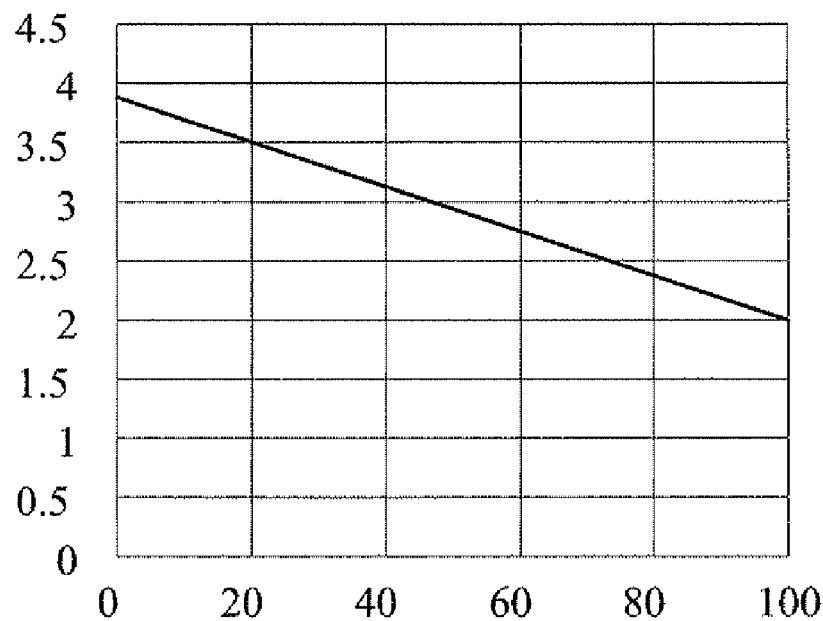
FIG. 6 is the circuit diagram II of an embodiment of the present invention.
Figure 6B:
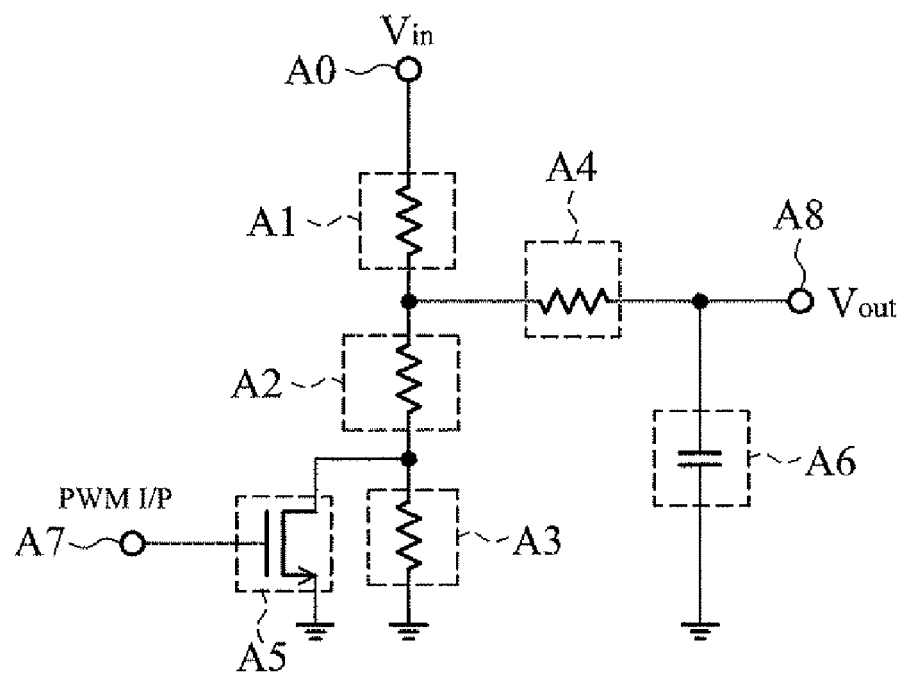

Referring to FIG. 6, 20% and 100% of the duty cycle are represented as reference points. When the duty cycle is 100% as indicated by V(100) the output voltage is 2 volts. When the duty cycle is 20% as indicated by V(20), the voltage output is 3.5 volts. At this moment the rated value of the first passive device A1 is known as 10K ohm and the rated value of the fourth passive device A4 is 200K ohm which is much larger than the rated value of the first passive device A1 and the rated value of the energy storage A6 is 1 μF. The rated value 6.67K ohm of the second passive device A2 and the rated value 27.77K ohm of the third passive device A3 are calculated from the split voltage and split current formula.

Figure 7A:
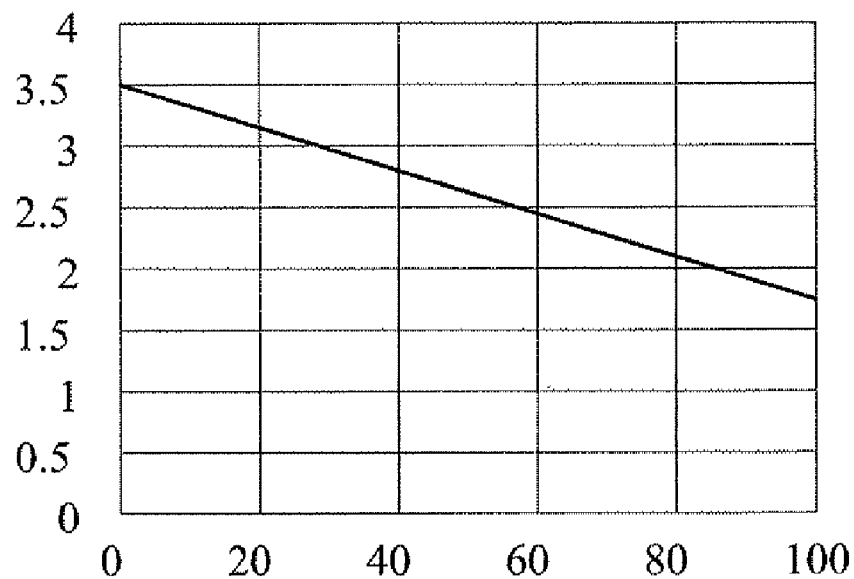
FIG. 7 is the circuit diagram III of an embodiment of the present invention.
Figure 7B:
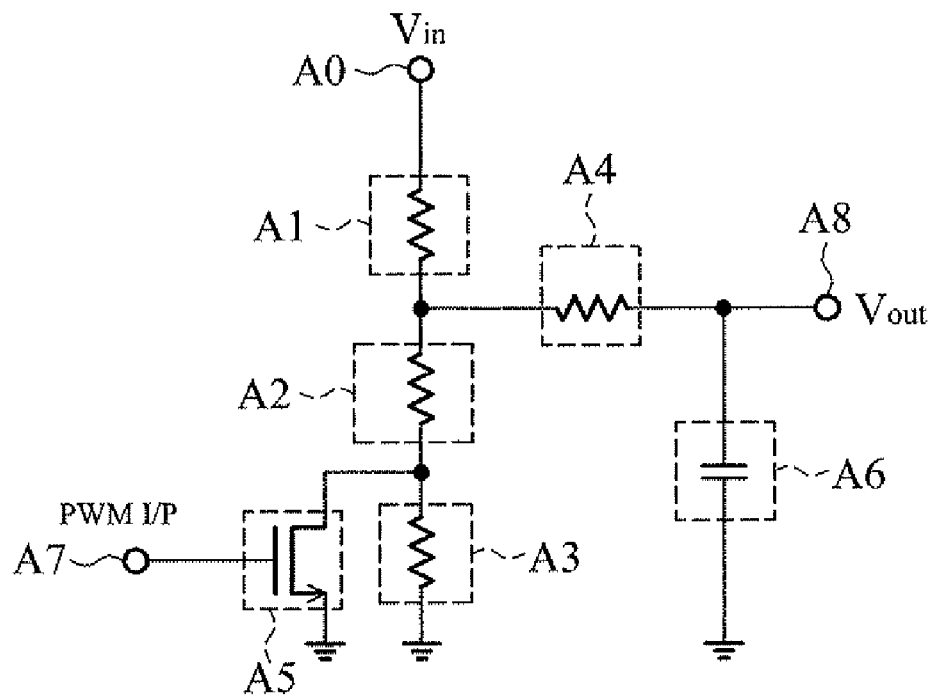

Referring to FIG. 7, 0% and 80% of the duty cycle are represented as reference points. When the duty cycle is 80% as indicated by V(80) the output voltage is 2 volts. When the duty cycle is 0% as indicated by V(0), the voltage output is 3.5 volts. At this moment the rated value of the first passive device A1 is known as 10K ohm and the rated value of the fourth passive device A4 is 200K ohm which is much larger than the rated value of the first passive device A1 and the rated value of the energy storage A6 is 1 μF. The rated value 4.81K ohm of the second passive device A2 and the rated value 18.52K ohm of the third passive device A3 are calculated from the split voltage and split current formula.

Figure 8A:
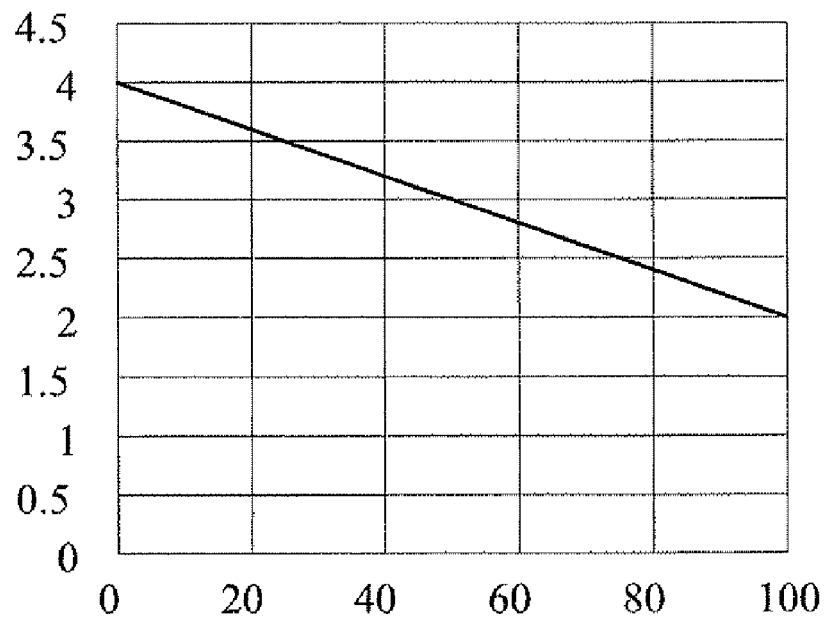
FIG. 8 is the circuit diagram VI of an embodiment of the present invention.
Figure 8B:
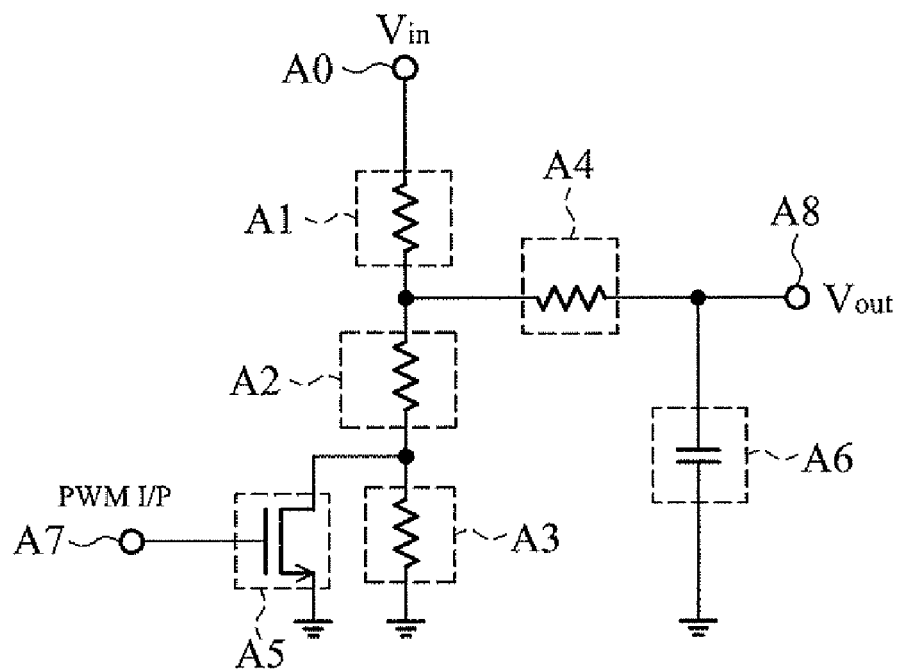

Referring to FIG. 8, 20% and 80% of the duty cycle are represented as reference points. When the duty cycle is 80% as indicated by V(80) the output voltage is 2 volts. When the duty cycle is 20% as indicated by V(20), the voltage output is 3.5 volts. At this moment the rated value of the first passive device A1 is known as 10K ohm and the rated value of the fourth passive device A4 is 200K ohm which is much larger than the rated value of the first passive device A1 and the rated value of the energy storage A6 is 1 μF. The rated value 4.29K ohm of the second passive device A2 and the rated value 35.75K ohm of the third passive device A3 are calculated from the split voltage and split current formula.

From above calculation when the rated value of the fourth passive device A4 is at least three times more than the rated value of the first passive device A1 if the proportion among the first passive device A1, the second passive device A2 and the third passive device A3 are maintained, i.e. the rated value of the third passive device A3 is larger than the rated value of the first passive device A1 and the rated value of the first passive device A1 is slightly larger than the rated value of the second passive device A2 the corresponding proportion of the voltage-cycle of the PWM circuit A will remain linear. At the same time if the energy storage device A6 is changed, the PWM circuit A will not be affected.

Figure 9:
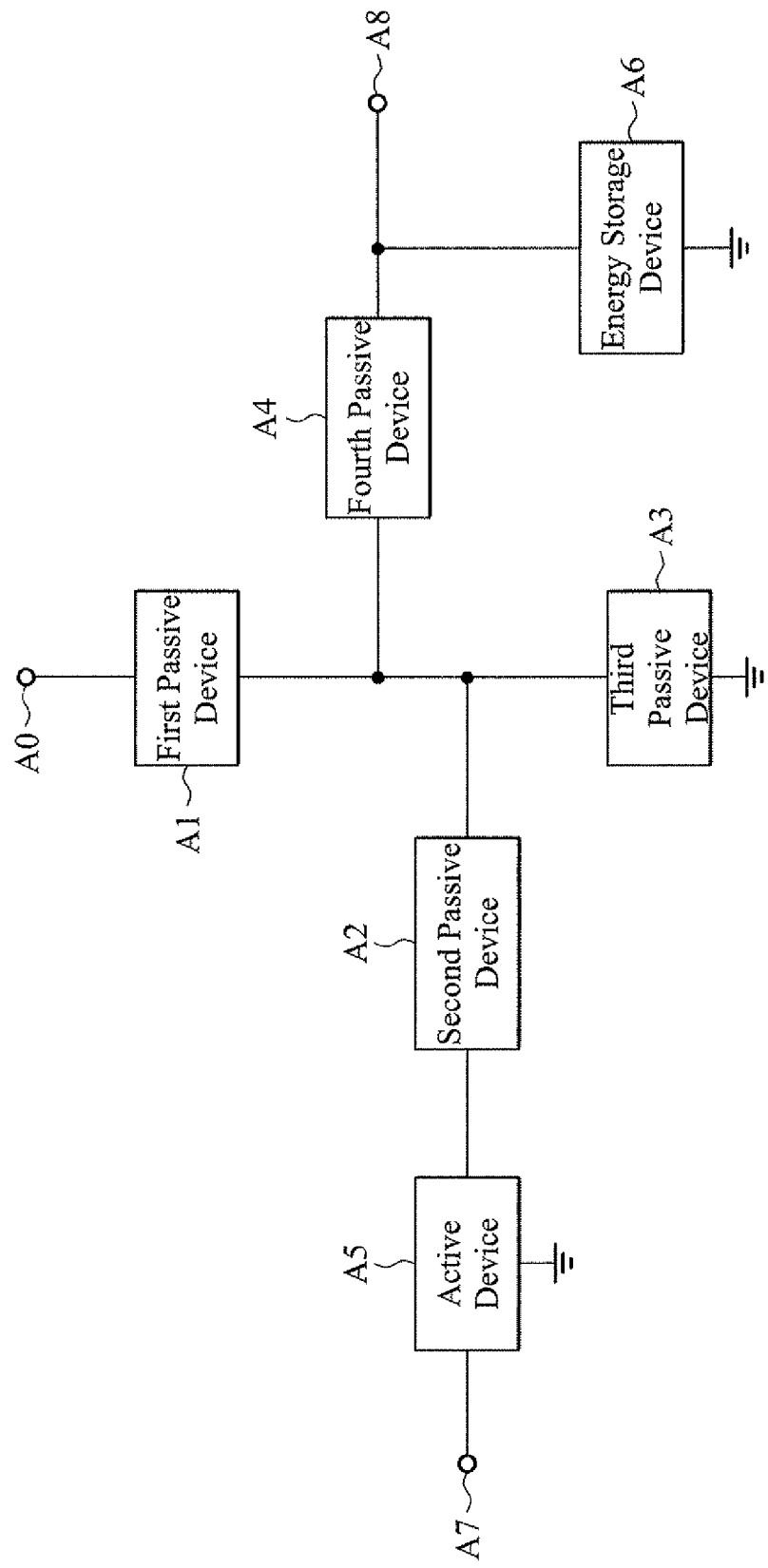
FIG. 9 is a circuit block diagram of another embodiment of the present invention.

Referring to FIG. 9, it is clear that the first passive device A1 and the third passive device A3 are connected in series between the power supply end A0 and a ground. Active device A5 and and the second passive device A2 are connected in series between the input end A7 and a point between the first passive device and the third passive device, the fourth passive device A4 is connected between the the output end A8 and the point between the first passive device A1 and the third passive device A3. The energy storage device A6 is connected between the output end A8 and a ground, and the rated value of the fourth passive device A4 is at least three times more than the rated value of the first passive device A1.

When the rated value of the fourth passive device A4 is much larger than the rated value of the first passive device A1, the voltage-cycle relationship of the PWM circuit A becomes linear. (referring to FIG. 2).

Figure 10:
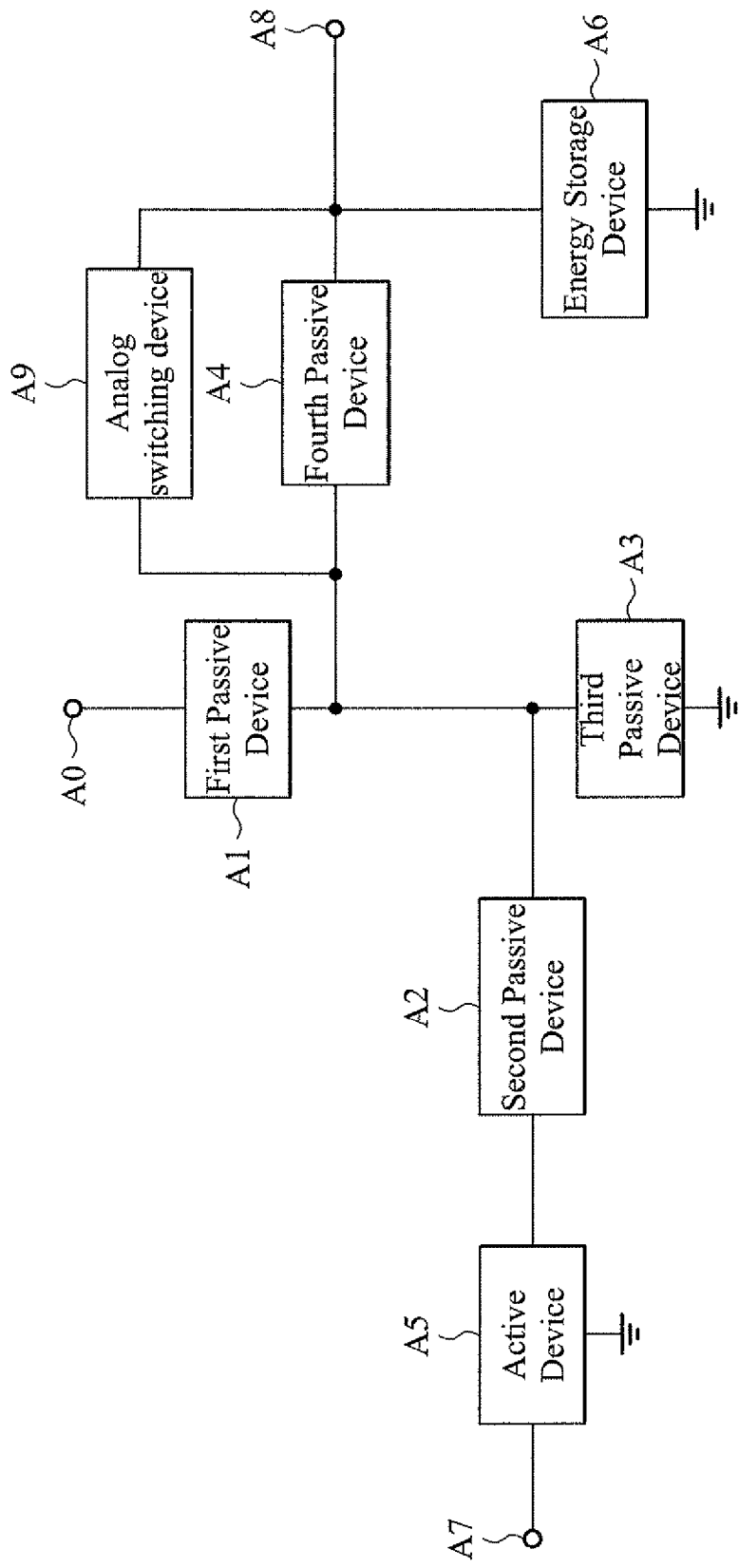
FIG. 10 is a circuit block diagram of another embodiment of the present invention.

Referring to FIG. 10, the both ends of the fourth passive device A4 are further connected with an analog switching device A9 in parallel to have the voltage-cycle relationship of the PWM circuit A changed from linear to parabolic (referring to FIG. 4) to enhance the work speed of the PWM circuit A.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A PWM switching direct voltage circuit, comprising a first passive device, a second passive device and a third passive device connected in series between a power supply and a ground such that the first passive device is connected to the second passive device and the second passive device is connected to the third passive device, wherein an active device is connected in parallel with said third passive device between said ground and a point between the second passive device and the third passive device, wherein:
   a fourth passive device is connected between an output end and a point between the first passive device and the second passive device, and an energy storage device is connected between said output end and a ground, wherein the rated value of the fourth passive device is at least three times more than the rated value of the first passive device.

2. A PWM switching direct voltage circuit according to claim 1, wherein the first passive device, the second passive device, the third passive device and the fourth passive device is one of the wire wound resistor, metallic film resistor, alloy film resistor, oxide metal film resistor, carbon resistor, carbon solid state resistor and cement resistor.

3. A PWM switching direct voltage circuit according to claim 1, wherein the active device is one of the bipolar junction transistor, field effect transistor, junction type field effect transistor, metal oxide semiconductor.

4. A PWM switching direct voltage circuit according to claim 1, wherein the energy storage device is one of the ceramic condenser, electrolytic condenser and tantalum condenser.

5. A PWM switching direct voltage circuit according to claim 1, wherein an analog switching device is connected in parallel with said fourth passive device.

6. A PWM switching direct voltage circuit according to claim 5, wherein the analog switching device is Schottky diode.

7. A PWM switching direct voltage circuit, comprising a first passive device and a third passive device connected in series between a power supply end and a ground, wherein an active device and a second passive device are connected in series between an input end and a point between the first passive device and the third passive device, wherein:
   a fourth passive device is connected between an output end and said point between the first passive device and the third passive device, and an energy storage device is connected between the output end and said ground, wherein the rated value of the fourth passive device is at least three times more than the rated value of the first passive device.

8. A PWM switching direct voltage circuit according to claim 7, wherein the first passive device, the second passive device, the third passive device and the fourth passive device is one of the wire wound resistor, metallic film resistor, alloy film resistor, oxide metal film resistor, carbon resistor, carbon solid state resistor and cement resistor.

9. A PWM switching direct voltage circuit according to claim 7, wherein the active device is one of the bipolar junction transistor, field effect transistor, junction type field effect transistor, metal oxide semiconductor.

10. A PWM switching direct voltage circuit according to claim 7, wherein the energy storage device is one of the ceramic condenser, electrolytic condenser and tantalum condenser.

11. A PWM switching direct voltage circuit according to claim 7, wherein the both ends of the fourth passive device are further connected with an analog switching device.

12. A PWM switching direct voltage circuit according to claim 11, wherein the analog switching device is Schottky diode.

* * * * *